(12) United States Patent
Watanabe et al.

(10) Patent No.: US 11,283,413 B2
(45) Date of Patent: Mar. 22, 2022

(54) AMPLIFICATION CIRCUIT

(71) Applicant: Murata Manufacturing Co., Ltd., Kyoto (JP)

(72) Inventors: Daisuke Watanabe, Kyoto (JP); Takayuki Tomita, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/554,887

(22) Filed: Aug. 29, 2019

(65) Prior Publication Data

US 2019/0386618 A1     Dec. 19, 2019

Related U.S. Application Data

(63) Continuation of application No. PCT/JP2018/006339, filed on Feb. 22, 2018.

(30) Foreign Application Priority Data

Mar. 1, 2017    (JP) ............................... JP2017-038495

(51) Int. Cl.
     *H03F 1/26*          (2006.01)
     *H03F 1/02*          (2006.01)
     (Continued)

(52) U.S. Cl.
CPC .............. *H03F 1/26* (2013.01); *H03F 1/0277* (2013.01); *H03F 3/193* (2013.01); *H03F 3/21* (2013.01); *H04B 1/0475* (2013.01)

(58) Field of Classification Search
CPC .......... H03F 1/26; H03F 1/0277; H03F 3/193; H03F 3/21; H03F 2203/7239; H03F 3/72;
(Continued)

(56) References Cited

U.S. PATENT DOCUMENTS 4,890,014 A    12/1989   Ramet
6,201,441 B1 *   3/2001   Suematsu ................. H03F 3/19
                                                     330/51
(Continued)

FOREIGN PATENT DOCUMENTS

JP      H01-161163 A     6/1989
JP      H08-335864 A    12/1996
(Continued)

OTHER PUBLICATIONS

International Search Report for International Application No. PCT/JP2018/006339 dated May 15, 2018.
(Continued)

*Primary Examiner* — Khanh V Nguyen
*Assistant Examiner* — Khiem D Nguyen
(74) *Attorney, Agent, or Firm* — Pearne & Gordon LLP

(57) ABSTRACT

An amplification circuit includes a filter circuit, an amplifier, a capacitor, a bypass line, and a switch circuit that includes a first FET and a second FET connected in series between one end and the other end of the bypass line, a first resistance element connected in series to a gate of the first FET, and a second resistance element connected in series to a gate of the second FET. A first control signal is supplied to the gate of the first FET. A second control signal is supplied to the gate of the second FET. A product of a gate length and a gate width of the first FET and a resistance value of the first resistance element is smaller than a product of a gate length and a gate width of the second FET and a resistance value of the second resistance element.

19 Claims, 14 Drawing Sheets

(51) Int. Cl.
*H03F 3/193* (2006.01)
*H03F 3/21* (2006.01)
*H04B 1/04* (2006.01)

(58) Field of Classification Search
CPC ......... H03F 2200/294; H03F 2200/451; H03F 3/189; H03G 3/10
USPC .......................... 330/296, 311, 51, 277, 302
See application file for complete search history.

(56) References Cited

U.S. PATENT DOCUMENTS

| | | | |
|---|---|---|---|
| 8,036,148 B2* | 10/2011 | Fukamachi | H04B 1/44 370/282 |
| 9,479,126 B2* | 10/2016 | Llkov | H03F 1/565 |
| 2002/0118067 A1* | 8/2002 | Hirayama | H03F 3/191 330/302 |
| 2015/0055733 A1 | 2/2015 | Asano et al. | |

FOREIGN PATENT DOCUMENTS

| | | |
|---|---|---|
| JP | H10-84300 A | 3/1998 |
| JP | 2000-332545 A | 11/2000 |
| JP | 2013-239775 A | 11/2013 |
| JP | 2015-226313 A | 12/2015 |

OTHER PUBLICATIONS

Written Opinion for International Application No. PCT/JP2018/006339 dated May 15, 2018.

* cited by examiner

AMPLIFICATION CIRCUIT

This is a continuation of International Application No. PCT/JP2018/006339 filed on Feb. 22, 2018 which claims priority from Japanese Patent Application No. 2017-038495 filed on Mar. 1, 2017. The contents of these applications are incorporated herein by reference in their entireties.

BACKGROUND

Technical Field

The present disclosure relates to an amplification circuit.

LNAs (low-noise amplifiers) are generally provided in radio communication systems, such as LANs (local area networks). An LNA for amplifying a reception signal received from an antenna does not need to amplify a reception signal with a sufficiently high intensity. In such a case, in order to prevent the occurrence of a distortion of a reception signal due to the transmission of the reception signal via the LNA, it is desirable that the reception signal be transmitted not via the LNA.

For example, Patent Document 1 discloses a high-frequency circuit including a low-noise amplification circuit, a bypass circuit for bypassing the low-noise amplification circuit, and a switch for switching between the low-noise amplification circuit and the bypass circuit. When the intensity of a reception signal is low, the switch is turned off and the reception signal is supplied to the low-noise amplification circuit. When the intensity of a reception signal is high, the switch is turned on and the reception signal is supplied to the bypass circuit.

Patent Document 1: Japanese Unexamined Patent Application Publication No. 2013-239775

BRIEF SUMMARY

As the switch for switching between the low-noise amplification circuit and the bypass circuit, a MOSFET (metal-oxide-semiconductor field-effect transistor) is often used. When a MOSFET is in the ON state, a channel is generally formed between the drain and the source of the MOSFET and an electric charge is stored. When the MOSFET is changed from the ON state to the OFF state, the electric charge leaks. In the configuration disclosed in Patent Document 1, this leakage of an electric charge is not taken into consideration. When the MOSFET is changed from the ON state to the OFF state (that is, at the time of switching from the bypass circuit to the low-noise amplifier), the electric charge leaked from the MOSFET may therefore propagate through a signal path and be stored in another element (for example, a capacitor). In this case, under the influence of the electric charge stored in another element, a time period required to complete the operation of the low-noise amplifier becomes longer. For example, in a case where MOSFETs are connected in multiple stages for the increase in the withstand voltage of a receiver, the total number of MOSFETs increases and the influence of electric charges leaked from the MOSFETs becomes larger.

The present disclosure provides an amplification circuit with which the improvement of a withstand voltage is realized and the time taken to complete the amplification operation of an amplifier is short.

An amplification circuit according to an aspect of the present disclosure includes a filter circuit to which an input signal is supplied, an amplifier provided at a stage subsequent to the filter circuit, a capacitor connected in series between an output of the filter circuit and an input of the amplifier, a bypass line one end of which is connected between the output of the filter circuit and the capacitor and the other end of which is connected to an output of the amplifier, and a switch circuit that is configured to control continuity of the bypass line in accordance with a first control signal and a second control signal, is turned on when a power level of the input signal is higher than or equal to a reference level and turned off when a power level of the input signal is lower than the reference level, and includes a first FET and a second FET connected in series in this order between the one end and the other end of the bypass line, a first resistance element connected in series to a gate of the first FET, and a second resistance element connected in series to a gate of the second FET. The first control signal is supplied to the gate of the first FET via the first resistance element. The second control signal is supplied to the gate of the second FET via the second resistance element. A product of a gate length and a gate width of the first FET and a resistance value of the first resistance element is smaller than a product of a gate length and a gate width of the second FET and a resistance value of the second resistance element.

According to the present disclosure, there can be provided an amplification circuit with which the improvement of a withstand voltage is realized and the time taken to complete the amplification operation of an amplifier is short.

DETAILED DESCRIPTION

Figure 1:
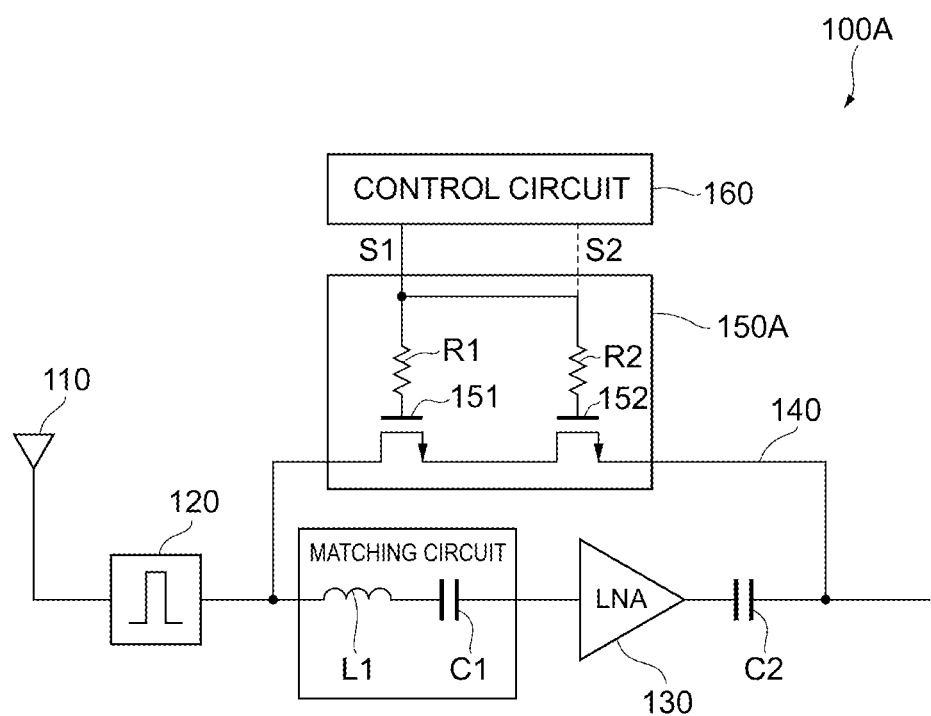
FIG. 1 is a diagram illustrating the exemplary configuration of an amplification circuit according to a first embodiment of the present disclosure.

An embodiment of the present disclosure will be described below with reference to the accompanying drawings. In the drawings, the same reference numeral is used to represent the same component or the same part so as to avoid repeated explanation.

FIG. 1 is a diagram illustrating the exemplary configuration of an amplification circuit according to a first embodiment of the present disclosure. An amplification circuit 100A illustrated in FIG. 1 is installed in devices such as cellular phones supporting wireless data communication, such as a wireless LAN or Bluetooth® and is used to amplify the power of a reception signal received by an antenna. In this specification, an exemplary case where the amplification circuit 100A is used in a receiving circuit for amplifying a reception signal will be described. However, the amplification circuit 100A may be used in a transmission circuit for amplifying a transmission signal.

The amplification circuit 100A includes, for example, an antenna 110, a filter circuit 120, an amplifier 130, a bypass line 140, a switch circuit 150A, a control circuit 160, an inductor L1, and capacitors C1 and C2. The respective components will be described in detail below.

The antenna 110 receives an RF (radio frequency) signal. The frequency of an RF signal is, for example, several GHz. The antenna 110 may also have a function of transmitting a transmission signal. Although the antenna 110 is illustrated in FIG. 1 for the convenience of explanation, the antenna 110 does not necessarily have to be included in the amplification circuit 100A and be connected to the amplification circuit 100A via an input/output terminal.

The filter circuit 120 is provided between the antenna 110 and the amplifier 130. The filter circuit 120 passes, for example, an RF signal (input signal) of a desired frequency and suppresses the other frequencies. Although not particularly limited, the filter circuit 120 may be, for example, a SAW (surface acoustic wave) filter.

The inductor L1 and the capacitor C1 are connected in series between the output of the filter circuit 120 and the input of the amplifier 130. The inductor L1 and the capacitor C1 constitute a matching circuit for matching the output impedance of the filter circuit 120 and the input impedance of the amplifier 130. The capacitor C1 removes the direct-current component of an RF signal. The inductor L1 and the capacitor C1 may be disposed in any order, and the inductor L1 may be disposed at a stage subsequent to the capacitor C1.

The amplifier 130 is disposed at a stage subsequent to the filter circuit 120 and is configured to amplify an input RF signal and output the amplified RF signal. In this specification, the amplifier 130 is an LNA (low-noise amplifier). The amplifier 130 may be, for example, a power amplifier or a signal processing amplifier.

One end of the capacitor C2 is connected to the output of the amplifier 130 and is configured to output an amplified signal from the other end thereof. The capacitor C2 removes the direct-current component of a signal output from the amplifier 130.

The bypass line 140 forms a path used to bypass the amplifier 130. Specifically, one end of the bypass line 140 is connected between the output of the filter circuit 120 and the capacitor C1 (the node between the output of the filter circuit 120 and the inductor L1 in FIG. 1), and the other end of the bypass line 140 is connected to the output of the amplifier 130 (the other end of the capacitor C2 in FIG. 1). When the power level of an RF signal received by the antenna 110 is relatively high, the bypass line 140 passes the RF signal to prevent the occurrence of a distortion of the RF signal due to the transmission of the RF signal through the amplifier 130. One end of the bypass line 140 may be connected to the node between the inductor L1 and the capacitor C1.

The switch circuit 150A controls the continuity of the bypass line 140 in accordance with a control signal supplied from the control circuit 160. Specifically, the switch circuit 150A includes an FET 151 (first FET), an FET 152 (second FET), a resistance element R1 (first resistance element), and a resistance element R2 (second resistance element). In this specification, the FETs 151 and 152 are n-channel MOSFETs (metal-oxide-semiconductor field-effect transistors). Although similar effects can be obtained in the case of a configuration in which p-channel MOSFETs are used, the detailed description of the configuration that is similar to the configuration in which the n-channel MOSFETs are used will be omitted.

The FETs 151 and 152 are connected in series in this order between one end and the other end of the bypass line 140. Specifically, the drain of the FET 151 is connected to the node between the filter circuit 120 and the inductor L1. The source of the FET 151 is connected to the drain of the FET 152. The source of the FET 152 is connected to the other end of the capacitor C2. The resistance element R1 is connected in series to the gate of the FET 151 and the resistance element R2 is connected in series to the gate of the FET 152, respectively. Control signals are supplied to the gates of the FETs 151 and 152 via the resistance elements R1 and R2, respectively. Since the FETs 151 and 152 are connected in multiple stages in the switch circuit 150A, a voltage applied between the source and drain of each FET is divided by the number of stages of the FETs. As compares with a configuration in which an FET is provided in a single stage, a withstand voltage is improved when the FETs 151 and 152 are in the OFF state. This prevents the FETs from being broken. The FETs 151 and 152 will be described in detail below.

The control circuit 160 controls the ON and OFF states of the switch circuit 150A in accordance with the power level of an RF signal. Specifically, when the power level of an RF signal is higher than or equal to a reference level, the amplifier 130 does not need to amplify the power of the RF signal. The control circuit 160 therefore outputs a control signal to bring the switch circuit 150A (that is, both of the FETs 151 and 152) into the ON state. As a result, the RF signal passes through the bypass line 140 (hereinafter also referred to as a bypass mode). On the other hand, when the power level of an RF signal is lower than the reference level, the power of the RF signal is amplified. The control circuit 160 therefore outputs a control signal to bring the switch circuit 150A (that is, at least one of the FETs 151 and 152) into the OFF state. As a result, the RF signal passes through the amplifier 130 (hereinafter also referred to as an amplification mode). In addition to the control for turning on and off the switch circuit 150A, control for turning on and off the amplifier 130 may be performed such that, for example, the amplifier 130 is in the OFF state in the bypass mode and the amplifier 130 is in the ON state in the amplification mode. An RF signal may be subjected to the detection of the power level thereof before being supplied to the filter circuit 120 or after passing through the filter circuit 120.

Next, the FETs 151 and 152 will be described in detail. In general, when a MOSFET is in the ON state, a channel is formed in a region that is between the drain and source of the MOSFET and is directly below the gate of the MOSFET. Electric charges are stored in the channel. At the time of switching from the ON state to the OFF state of the MOSFET, a phenomenon (charge injection) in which the stored electric charges leak to the drain and the source occurs. The leaked electric charges may propagate through a signal path and be stored in another element (for example, a capacitor).

For example, if the FETs 151 and 152 are simultaneously switched from the ON state to the OFF state, the electric charges stored in the channels at the FETs 151 and 152 may leak and be stored in the capacitor C1 and the filter circuit 120 that acts like a capacitor. In the amplification circuit 100A, a line from the output of the filter circuit 120 to one end of the capacitor C1 and a line from the drain of the FET 151 to the node between the filter circuit 120 and the inductor L1 have relatively higher impedances than the other regions (these lines are hereinafter also referred to as a high-impedance region). It therefore takes time for the electric charges stored in the capacitor C1 and the filter circuit 120 to discharge. The potential of the high-impedance region moderately changes. Accordingly, at the time of the switching from the ON state to the OFF state of the FETs 151 and 152 (that is, the switching from the bypass mode to the amplification mode), the amplification operation of the amplifier 130 is overshot first and then it takes time to complete the amplification operation.

In this embodiment, by making the time at which the FET 151 is switched from the ON state to the OFF state and the time at which the FET 152 is switched from the ON state to the OFF state different from each other, the amount of electric charge stored in another element among the electric charges stored in the FETs 151 and 152 is reduced. Specifically, the switching times of the FETs 151 and 152 are made different from each other using, for example, the following two configurations.

In the first configuration, the FETs 151 and 152 are designed such that the time constant with which the FET 151 is switched from the ON state to the OFF state is smaller than the time constant with which the FET 152 is switched from the ON state to the OFF state. That is, the respective FETs are designed such that the product of the gate length and gate width of the FET 151 and the resistance value of the resistance element R1 is smaller than the product of the gate length and gate width of the FET 152 and the resistance value of the resistance element R2. Specifically, a product of a gate length and a gate width of an FET and a resistance value of a resistance element is a product of a numerical value (a numeral followed by a unit for length like "m") of the gate length of the FET and the numerical value of the gate width of the FET and a numerical value (a numeral followed by a unit for resistance value like "Ω"). Numerals arranged in front of a unit for length or resistance value include both of a specific numeral like 1, 2, 3 . . . and units for number such as "p" or "n". As a result, for example, even if a control signal S1 (the first and second control signals represented by a solid line in FIG. 1) is simultaneously supplied to the gates of the FETs 151 and 152, the FET 151 is switched from the ON state to the OFF state first and then the FET 152 is switched from the ON state to the OFF state.

In the second configuration, the time at which a control signal is supplied to the gate of the FET 151 and the time at which a control signal is supplied to the gate of the FET 152 are made different from each other. That is, the control circuit 160, for example, selects the control signal S1 (the first control signal represented by the solid line in FIG. 1) to be supplied to the gate of the FET 151 and then selects a control signal S2 (the second control signal represented by a broken line in FIG. 1) to be supplied to the gate of the FET 152. As a result, for example, even if the FETs 151 and 152 have the same characteristics, the FET 151 is switched from the ON state to the OFF state first and then the FET 152 is switched from the ON state to the OFF state. Next, the operations of the FETs 151 and 152 will be described in detail in chronological order with reference to FIGS. 2A to 2C.

Figure 2A:
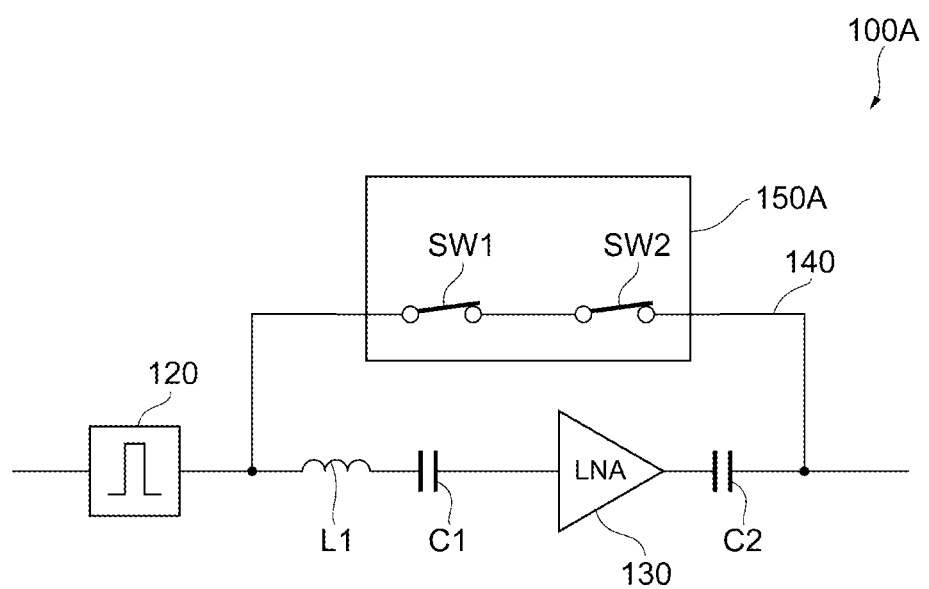
FIG. 2A is a diagram describing the operation of an amplification circuit according to the first embodiment of the present disclosure.
Figure 2B:
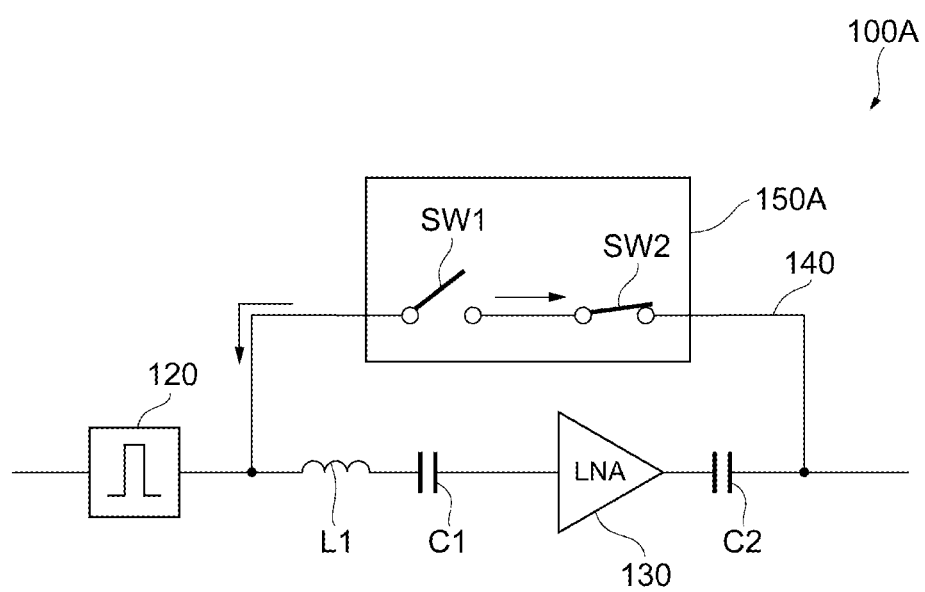
FIG. 2B is a diagram describing the operation of an amplification circuit according to the first embodiment of the present disclosure.
Figure 2C:
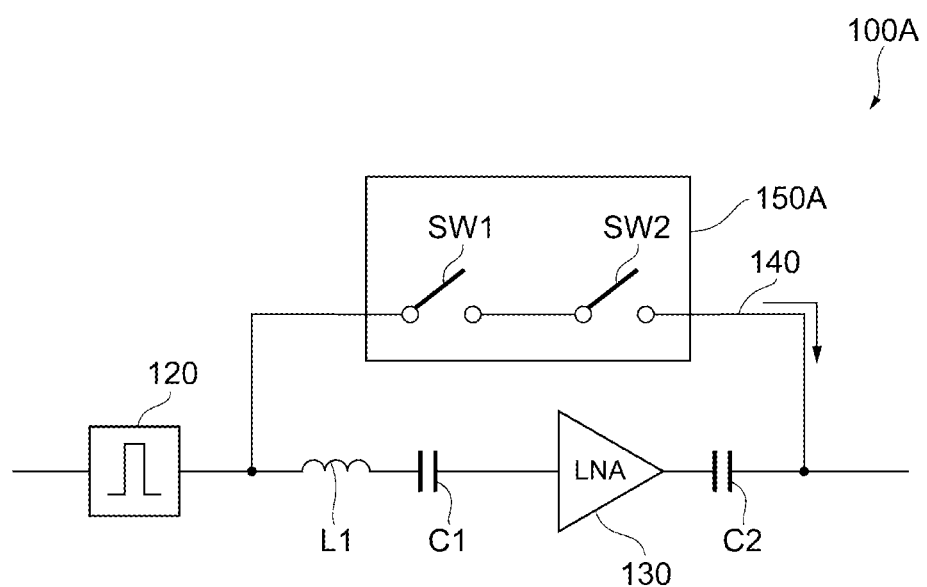
FIG. 2C is a diagram describing the operation of an amplification circuit according to the first embodiment of the present disclosure.

FIGS. 2A to 2C are diagrams describing the operation of an amplification circuit according to the first embodiment of the present disclosure. In FIGS. 2A to 2C, switch elements SW1 and SW2 are illustrated instead of the FETs 151 and 152, respectively, for the convenience of description. The resistance elements R1 and R2, the antenna 110, and the control circuit 160 in the amplification circuit 100A are not illustrated, and are not also illustrated in FIGS. 4A to 4D and 5A to 5E to be described below.

FIG. 2A illustrates the amplification circuit 100A in the bypass mode. Both of the switch elements SW1 and SW2 are in the ON state. In a case where the amplification circuit 100A is switched from the bypass mode to the amplification mode, the switch element SW1 (that is, the input-side FET on the bypass line 140) is turned off before the switch element SW2 (the output-side FET on the bypass line 140) is turned off as illustrated in FIG. 2B. The electric charges stored in the switch element SW1 substantially equally leak to the high-impedance region and the output side of the bypass line 140 (see arrows in FIG. 2B). Subsequently, as illustrated in FIG. 2C, the switch element SW2 is turned off. At that time, there is no continuity between the switch element SW2 and the high-impedance region. The electric charge stored in the switch element SW2 therefore leaks to the output side of the bypass line 140 (see an arrow in FIG. 2C).

Referring back to FIG. 1, as described above, even though a plurality of FETs are connected in multiple stages, the leakage of the electric charge stored in the FET 152 on the output side of the bypass line 140 to the high-impedance region is suppressed in the amplification circuit 100A. The amount of electric charges stored in the filter circuit 120 and the capacitor C1 is reduced in the amplification circuit 100A as compared with a configuration (hereinafter also referred to as a comparative example) in which a plurality of FETs are simultaneously switched from the ON state to the OFF state. Consequently, in the amplification circuit 100A, a withstand voltage is improved, the time taken to complete the amplification operation of an amplifier is shortened as compared with the comparative example, and an operation stabilization speed at the time of switching from the bypass mode to the amplification mode is increased.

The FETs 151 and 152 do not necessarily have to be MOSFETs, and may be FETs of another type, such as JFETs (junction field-effect transistors) or MOSFETs (metal-semi-conductor field-effect transistors).

The number of FETs connected in multiple stages is not limited to 2 and may be 3 or more as will be described below.

Figure 3:
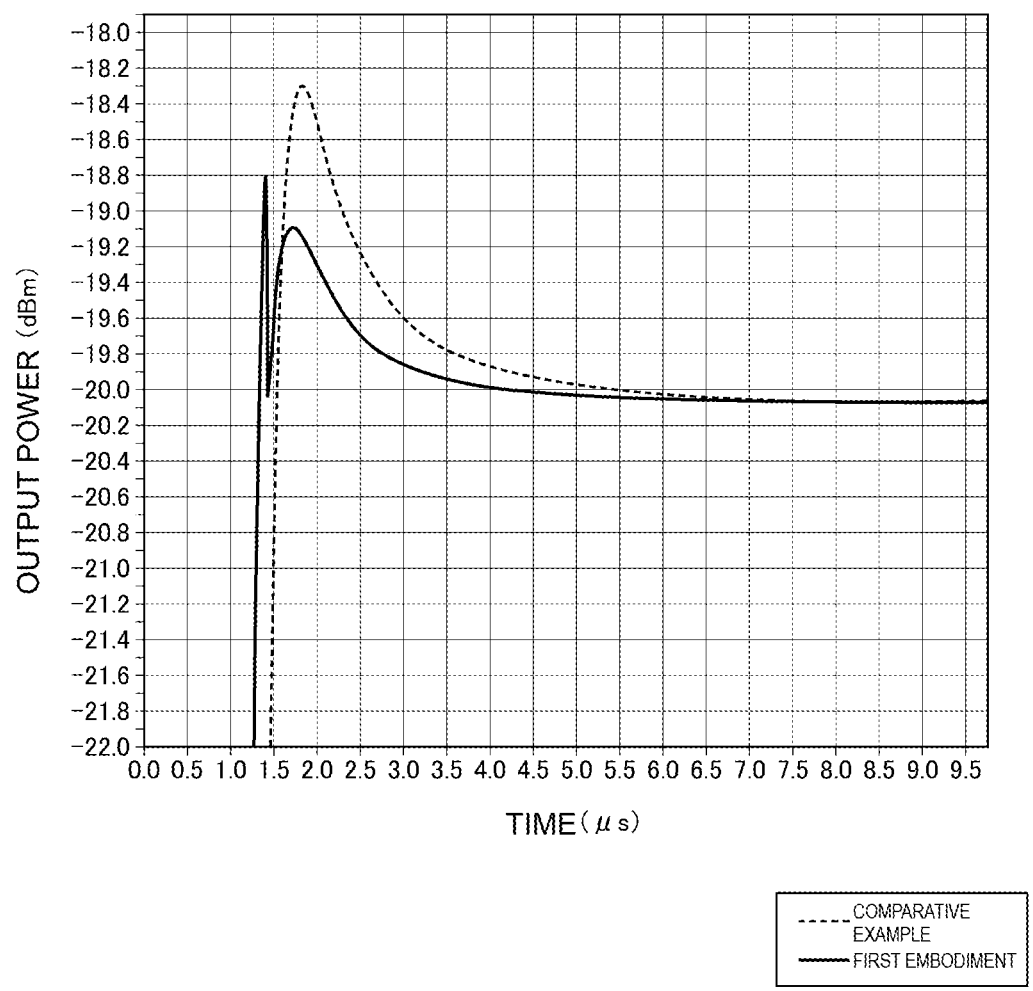
FIG. 3 is a graph illustrating examples of simulation results of amplification operations performed by an amplification circuit according to the first embodiment of the present disclosure and an amplification circuit that is a comparative example.

FIG. 3 is a graph illustrating examples of simulation results of amplification operations performed by an amplification circuit according to the first embodiment of the present disclosure and an amplification circuit that is a comparative example. In the graph illustrated in FIG. 3, a vertical axis represents the output power (dBm) of the amplifier 130 and a horizontal axis represents time (μs).

As illustrated in FIG. 3, in the comparative example, the output power of the amplifier 130 peaks at approximately −18.3 dBm and then reaches a steady state. The time taken for the output voltage to reach approximately −20.0 dBm from the peak is approximately 3.5 μs. On the other hand, in the amplification circuit 100A, the output power of the amplifier 130 peaks at approximately −18.8 dBm and then reaches a state. The time taken for the output voltage to reach approximately −20.0 dBm from the peak is approximately 2.8 μs. As is also apparent from these simulation results, the time taken to complete the operation of the amplifier 130 is shortened in the amplification circuit 100A as compared with the comparative example.

FIGS. 4A to 4D are diagrams describing the operation of an amplification circuit according to a second embodiment of the present disclosure. The same reference numerals are used to identify parts already described in the amplification circuit 100A, and the description thereof will be omitted. In the second embodiment, descriptions of things that are common to the first embodiment will be omitted and only different points will be described. In particular, descriptions of similar operations and effects based on similar configurations will not be repeated in every embodiment.

As illustrated in FIGS. 4A to 4D, an amplification circuit 100B includes a switch circuit 150B instead of the switch circuit 150A in the amplification circuit 100A and further includes a switch element SW4.

The switch circuit 150B includes the switch element SW1 (the first FET), the switch element SW2, and a switch element SW3 (the second FET). The switch elements SW1 to SW3 schematically represent the operations of FETs that are provided in three stages and are connected in series in this order between one end and the other end of the bypass line 140. Also in the switch circuit 150B, the switch element SW1 is switched from the ON state to the OFF state first and then the switch elements SW2 and SW3 are switched from the ON state to the OFF state at the time of switching from the bypass mode to the amplification mode like in the switch circuit 150A.

The switching times of the switch elements SW1 to SW3 are made different from each other using the same configurations employed in the switch circuit 150A. That is, in the first configuration, the time constants with which the respective FETs forming the switch elements SW1 to SW3 are switched from the ON state to the OFF state are made different from each other. In this case, the respective FETs are designed such that the product of the gate length and gate width of the FET forming the switch element SW1 and the resistance value of the resistance element connected to the gate is smaller than the product of the gate length and gate width of the FET forming each of the switch elements SW2 and SW3 and the resistance value of the resistance element connected to the gate. In the second configuration, the times at which a control signal is supplied to the switch elements SW1 to SW3 are made different from each other. In this case, a control circuit (not illustrated) selects, for example, a control signal (first control signal) to be supplied to the gate of the FET forming the switch element SW1 and then selects control signals (second control signals) to be supplied to the gates of the switch elements SW2 and SW3.

One end of the switch element SW4 (first switch element) is connected between the switch elements SW2 and SW3, and the other end of the switch element SW4 is connected to the ground. The switch element SW4 operates to be turned off in the bypass mode and be turned on in the amplification mode in accordance with a control signal (third control signal) supplied from the control circuit (not illustrated). The operations of the switch elements SW1 to SW4 will be described in detail below in chronological order.

Figure 4A:
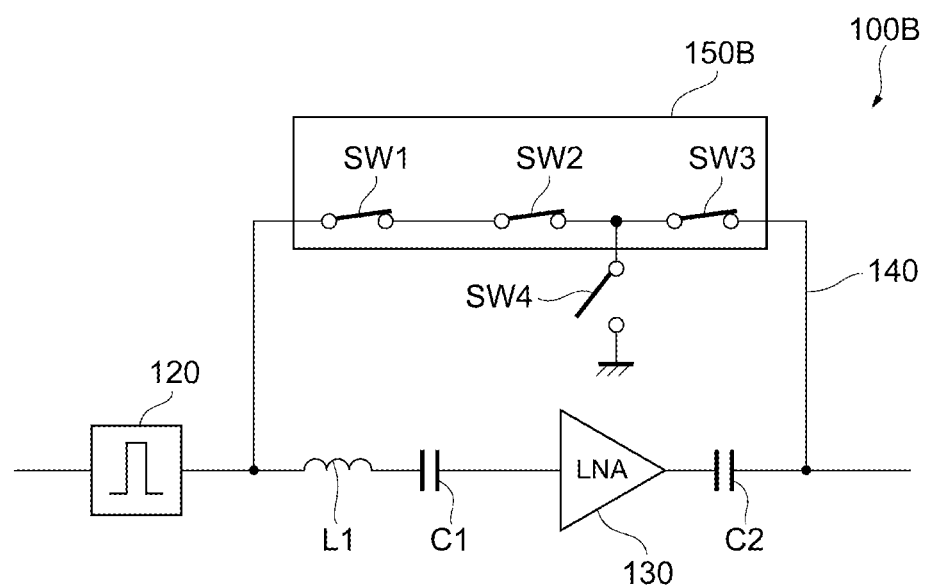
FIG. 4A is a diagram describing the operation of an amplification circuit according to a second embodiment of the present disclosure.
Figure 4B:
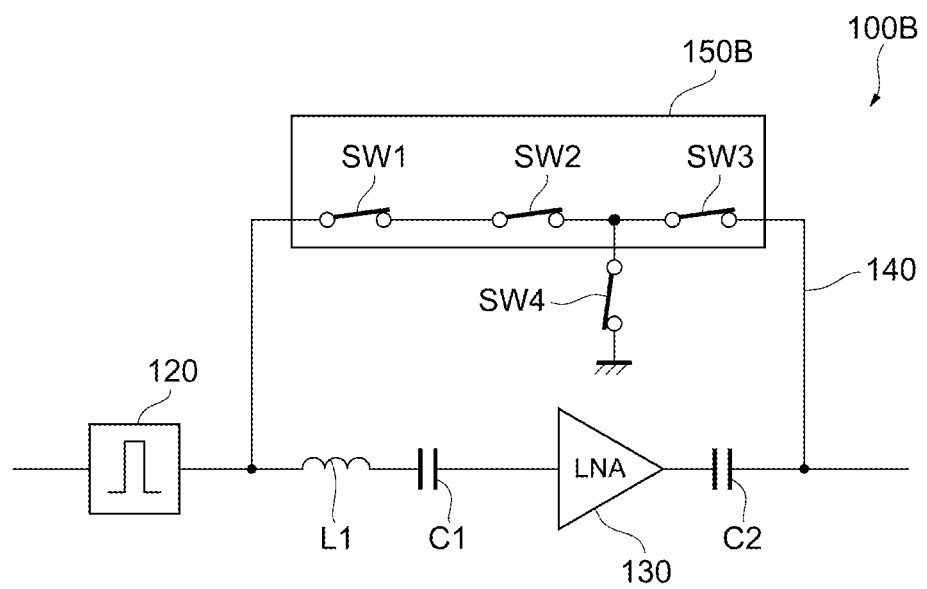
FIG. 4B is a diagram describing the operation of an amplification circuit according to the second embodiment of the present disclosure.
Figure 4C:
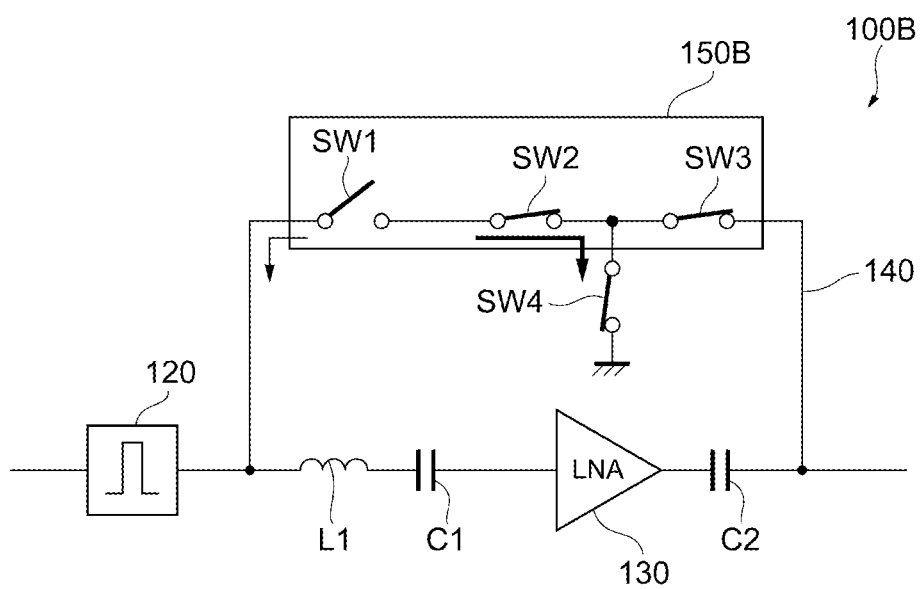
FIG. 4C is a diagram describing the operation of an amplification circuit according to the second embodiment of the present disclosure.
Figure 4D:
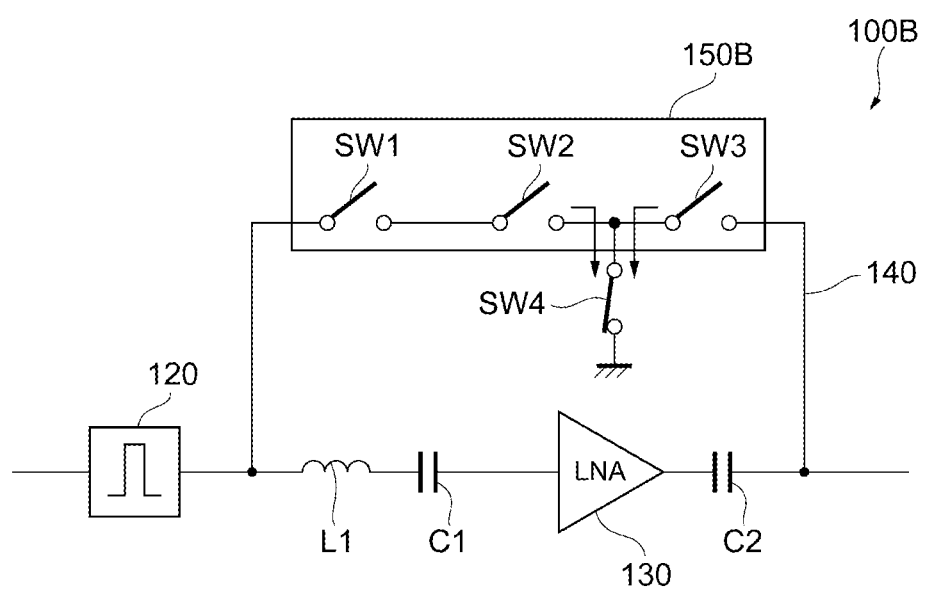
FIG. 4D is a diagram describing the operation of an amplification circuit according to the second embodiment of the present disclosure.

FIG. 4A illustrates the amplification circuit 100B in the bypass mode. The switch elements SW1 to SW3 are on the ON state and the switch element SW4 is in the OFF state. In a case where the amplification circuit 100B is switched from the bypass mode to the amplification mode, a signal to be supplied to the switch element SW4 is selected such that the switch element SW4 is turned on before the switch element SW1 is turned off as illustrated in FIG. 4B. As a result, a line through which the electric charges stored in the switch elements SW1 to SW3 are conducted to the ground is formed. Subsequently, as illustrated in FIG. 4C, the switch element SW1 (that is, the input-side FET on the bypass line 140) is turned off. A larger amount of electric charge flows from the switch element SW1 stored therein to the ground via the switch element SW4 than to the high-impedance region (see arrows in FIG. 4C). The storage of electric charges in the filter circuit 120 and the capacitor C1 due to the switch element SW1 is therefore suppressed. Subsequently, as illustrated in 4D, the switch elements SW2 and SW3 are turned off. Since there is no continuity between each of the switch elements SW2 and SW3 and the high-impedance region, the electric charges stored in the switch elements SW2 and SW3 flow to the ground via the switch element SW4 (see arrows in FIG. 4D).

Thus, in the amplification circuit 100B, the majority of the electric charge stored in the switch element SW1 and the electric charges stored in the switch elements SW2 and SW3 flow to the ground via the switch element SW4. In the amplification circuit 100B, the amount of electric charge stored in the filter circuit 120 and the capacitor C1 at the time of mode switching is therefore further reduced as compared with the amplification circuit 100A. Consequently, in the amplification circuit 100B, the time taken to complete the amplification operation of an amplifier is further shortened as compared with the amplification circuit 100A, and an operation stabilization speed at the time of switching from the bypass mode to the amplification mode is further increased.

The order in which the switch elements SW2 and SW3 are turned off is not particularly limited. For example, the switch elements SW2 and SW3 may be simultaneously turned off, or one of them may be turned off first.

FIG. 4A to 4D illustrate the configuration in which one end of the switch element SW4 is connected between the switch elements SW2 and SW3. However, one end of the switch element SW4 may be connected, for example, between the switch elements SW1 and SW2.

The number of switch elements (that is, FETs) connected in multiple stages is not limited to 3 and may be 2 or 4 or more.

FIGS. 5A to 5E are diagrams describing the operation of an amplification circuit according to a third embodiment of the present disclosure. The same reference numerals are used to identify parts already described in the amplification circuit 100B, and the description thereof will be omitted. As illustrated in FIGS. 5A to 5E, an amplification circuit 100C includes a switch element SW5 in addition to the components included in the amplification circuit 100B.

One end of the switch element SW5 (second switch element) is connected between the inductor L1 and the capacitor C1 and the other end of the switch element SW5 is connected to the ground. The switch element SW5 operates to be turned on in the bypass mode and be turned off in the amplification mode in accordance with a control signal (fourth control signal) supplied from a control circuit (not illustrated). The operations of the switch elements SW1 to SW5 will be described in detail below in chronological order.

Figure 5A:
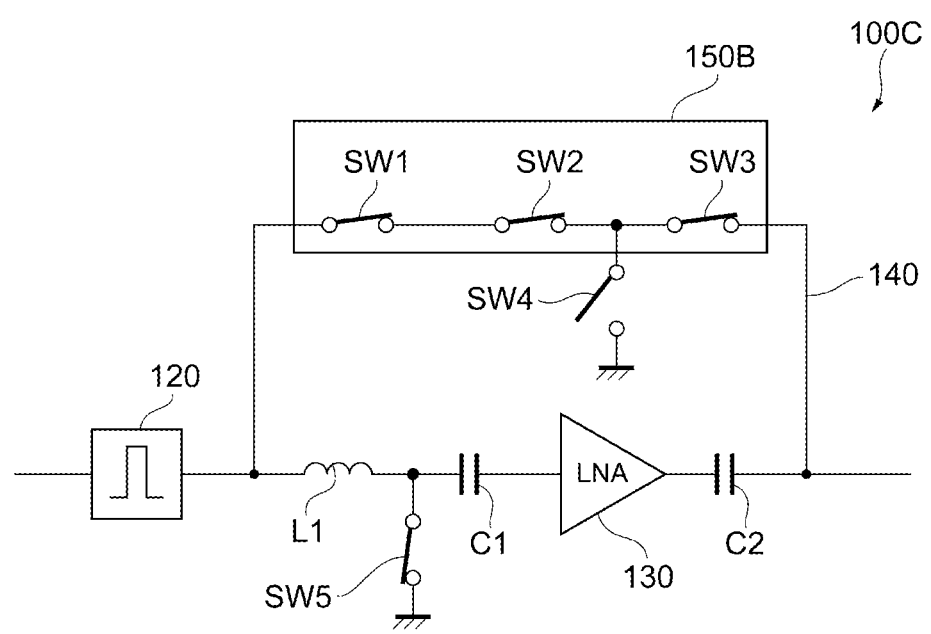
FIG. 5A is a diagram describing the operation of an amplification circuit according to a third embodiment of the present disclosure.
Figure 5B:
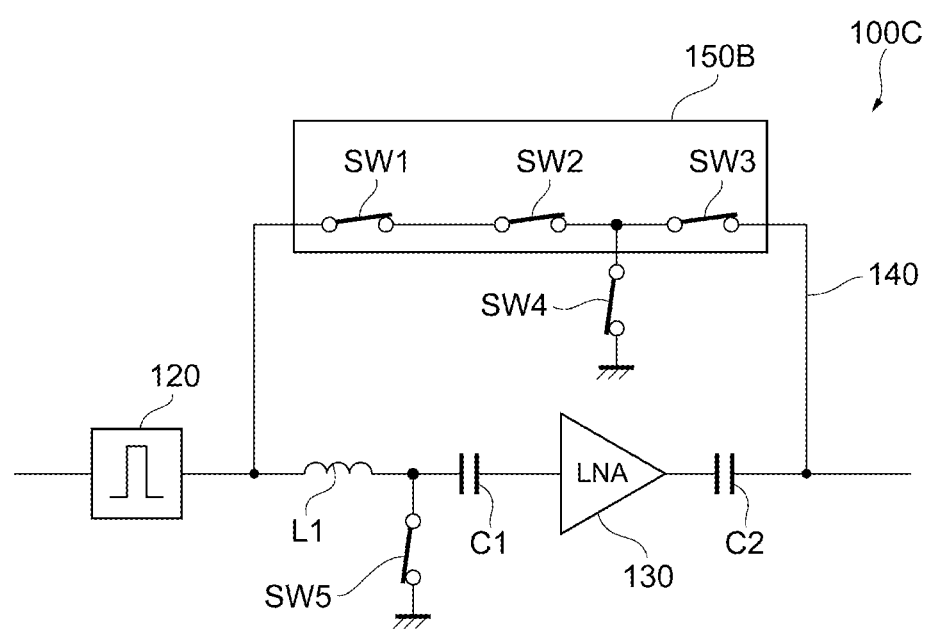
FIG. 5B is a diagram describing the operation of an amplification circuit according to the third embodiment of the present disclosure.
Figure 5C:
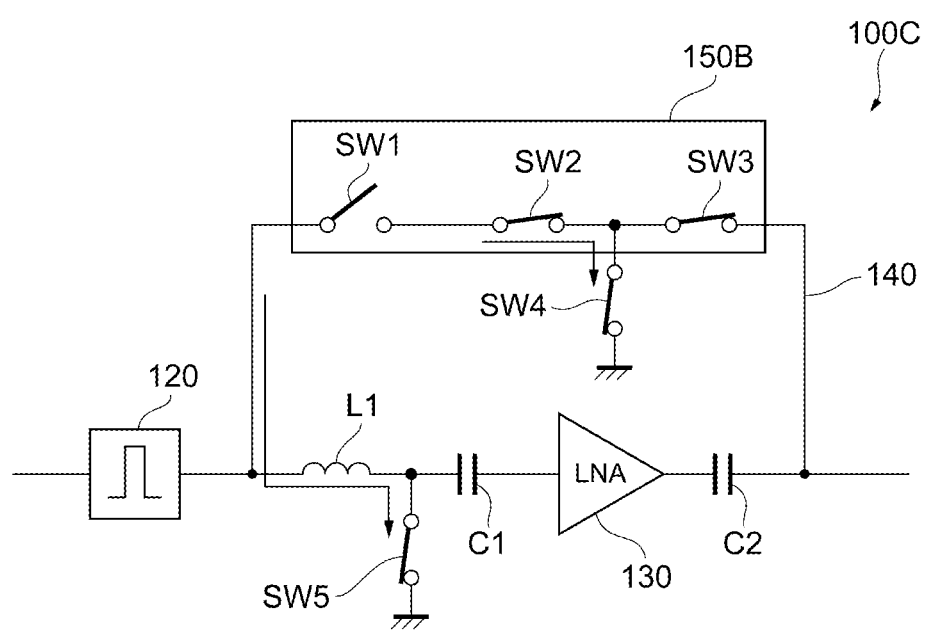
FIG. 5C is a diagram describing the operation of an amplification circuit according to the third embodiment of the present disclosure.
Figure 5D:
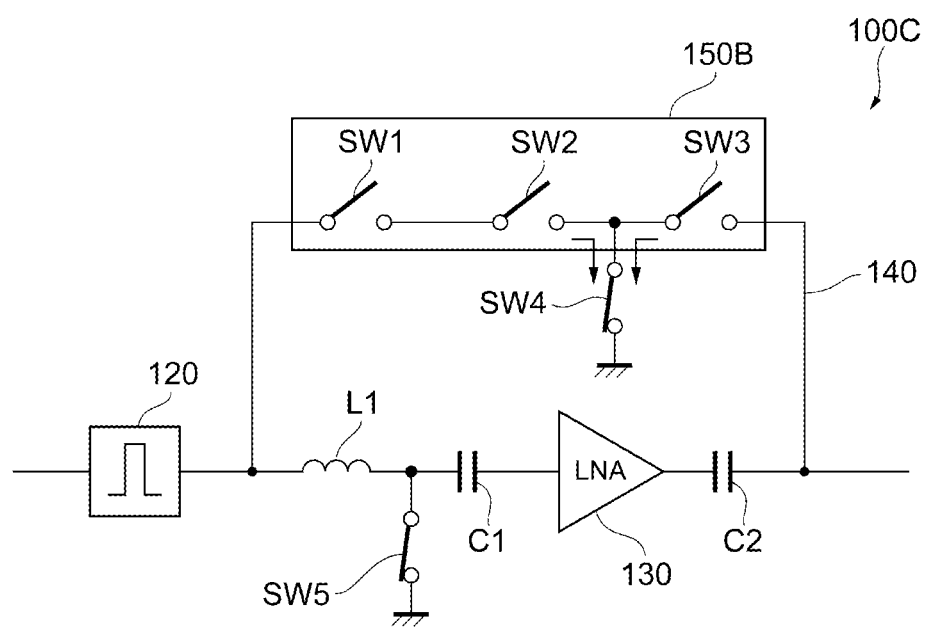
FIG. 5D is a diagram describing the operation of an amplification circuit according to the third embodiment of the present disclosure.
Figure 5E:
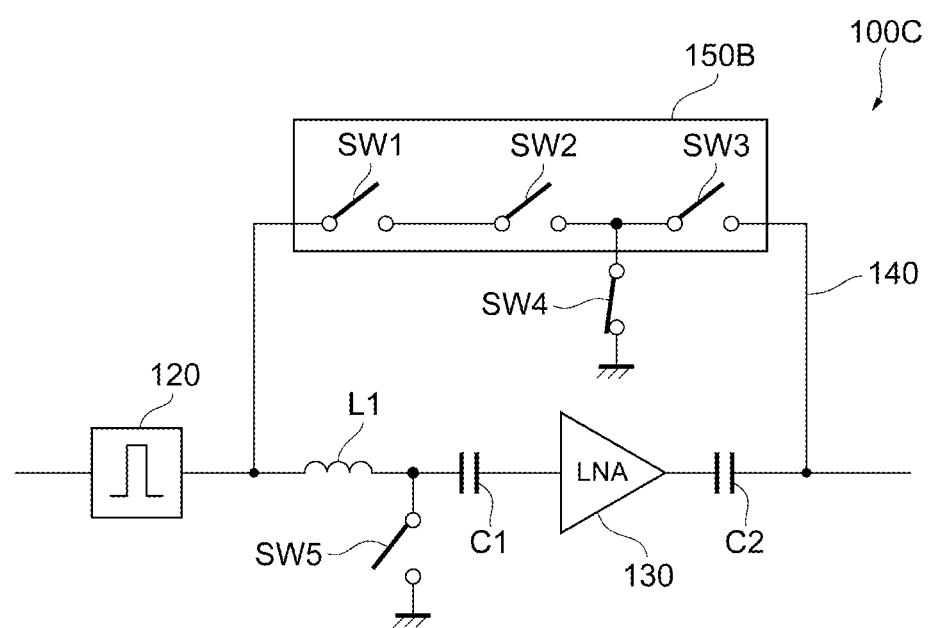
FIG. 5E is a diagram describing the operation of an amplification circuit according to the third embodiment of the present disclosure.

FIG. 5A illustrates the amplification circuit 100C in the bypass mode. The switch elements SW1 to SW3 and SW5 are in the ON state and the switch element SW4 is in the OFF state. In a case where the amplification circuit 100C is switched from the bypass mode to the amplification mode, a signal to be supplied to the switch element SW4 is selected such that the switch element SW4 is turned on before the switch element SW1 is turned off as illustrated in FIG. 5B. As a result, a line through which the electric charges stored in the switch elements SW1 to SW3 are conducted to the ground is formed. Subsequently, as illustrated in FIG. 5C, the switch element SW1 (that is, the input-side FET on the bypass line 140) is turned off. Even if the electric charge stored in the switch element SW1 leaks to the high-impedance region, the electric charge is not stored in the filter circuit 120 and the capacitor C1 and flows to the ground via the switch element SW5. Alternatively, the electric charge flows to the ground via the switch element SW4 (see, an arrow in FIG. 5C). The storage of electric charges in the filter circuit 120 and the capacitor C1 due to the switch element SW1 is therefore suppressed. Subsequently, as illustrated in 5D, the switch elements SW2 and SW3 are turned off. Since there is no continuity between each of the switch elements SW2 and SW3 and the high-impedance region, the electric charges stored in the switch elements SW2 and SW3 flow to the ground via the switch element SW4 (see arrows in FIG. 5D). Subsequently, the switch element SW5 is turned off as illustrated in FIG. 5E, so that the amplifier 130 is operable.

Thus, in the amplification circuit 100C, the electric charges stored in the switch elements SW1 to SW3 flow to the ground not only via the switch element SW4 but also via the switch element SW5. In the amplification circuit 100C, the amount of electric charge stored in the filter circuit 120 and the capacitor C1 at the time of mode switching is therefore further reduced as compared with the amplification circuits 100A and 100B. Consequently, in the amplification circuit 100C, the time taken to complete the amplification operation of an amplifier is further shortened as compared with the amplification circuits 100A and 100B, and an operation stabilization speed at the time of switching from the bypass mode to the amplification mode is further increased.

The order in which the switch elements SW2 and SW3 are turned off is not particularly limited. For example, the switch elements SW2 and SW3 may be simultaneously turned off, or one of them may be turned off first. The switch element SW5 does not necessarily have to be turned off after the other ones of the switch elements SW1 to SW5 have been turned off, and may be turned off any time on condition that it is turned off after the switch element SW1 has been turned off.

FIG. 5A to 5E illustrate the configuration in which one end of the switch element SW5 is connected between the inductor L1 and the capacitor C1. However, one end of the switch element SW5 may be connected to any node between the output of the filter circuit 120 and the capacitor C1.

The number of switch elements (that is, FETs) connected in multiple stages is not limited to 3 and may be 2 or 4 or more.

The amplification circuit 100C does not necessarily have to include the switch element SW4.

Exemplary embodiments of the present disclosure have been described above. Each of the amplification circuits 100A to 100C includes the bypass line 140 for bypassing the amplifier 130 and the switch circuit 150A or 150B for controlling the continuity of the bypass line 140. The product of the gate length and gate width of the FET 151 in the switch circuit 150A or 150B and the resistance value of the resistance element R1 is smaller than the product of the gate length and gate width of the FET 152 and the resistance value of the resistance element R2. As a result, after the FET 151 has been turned off at the time of mode switching, the FET 152 is turned off. The leakage of the electric charge stored in the FET 152 to the high-impedance region is therefore suppressed. Accordingly, the time taken to complete the amplification operation of an amplifier becomes shorter in the amplification circuits 100A to 100C as compared with a comparative example.

Each of the amplification circuits 100B and 100C further includes the switch element SW4 that connects a point between the FETs 151 and 152 to the ground. The switch element SW4 is turned on before the FET 151 is turned off. In the amplification circuits 100B and 100C, the electric charges stored in the switch elements SW1 to SW3 therefore flow to the ground via the switch element SW4. Consequently, the time taken to complete the amplification operation of an amplifier becomes shorter in the amplification circuits 100B and 100C as compared with the amplification circuit 100A.

Each of the amplification circuits 100A to 100C includes the bypass line 140 for bypassing the amplifier 130 and the switch circuit 150A or 150B for controlling the continuity of the bypass line 140. A control signal is supplied to the gate of each FET such that the FET 152 is turned off after the FET 151 has been turned off in the switch circuit 150A or 150B. Since the FET 152 is turned off after the FET 151 has been turned off at the time of mode switching, the leakage of the electric charge stored in the FET 152 to the high-impedance region is suppressed. Accordingly, a withstand voltage is improved and the time taken to complete the amplification operation of an amplifier becomes shorter in the amplification circuits 100A to 100C as compared with a comparative example.

The embodiments described above are intended to help easily understand the present disclosure and is not to be used to construe the present disclosure in a limiting fashion. The present disclosure may be modified or improved without necessarily departing from the gist thereof, and equivalents of such modifications or improvements are also included in the present disclosure. That is, the embodiment may be appropriately modified in design by those skilled in the art, and such modifications also fall within the scope of the present disclosure so long as the modifications include the features of the present disclosure. For example, elements included in the embodiments and the arrangements, materials, conditions, shapes, sizes, and so on thereof are not limited to those illustrated exemplarily but can be modified as appropriate. Elements included in the embodiment can be combined as much as technically possible, and such combinations of elements also fall within the scope of the present disclosure so long as the combinations of elements include the features of the present disclosure.

REFERENCE SIGNS LIST 100A to 100C amplification circuit
110 antenna
120 filter circuit
130 amplifier
140 bypass line
150A and 150B switch circuit
151 and 152 FET
160 control circuit
L1 inductor
C1 and C2 capacitor
R1 and R2 resistance element
SW1 to SW5 switch element

The invention claimed is:

1. An amplification circuit comprising:
a filter circuit to which an input signal is supplied;
an amplifier provided at a stage subsequent to the filter circuit;
a capacitor connected in series between an output of the filter circuit and an input of the amplifier;
a bypass line one end of which is connected between the output of the filter circuit and the capacitor and the other end of which is connected to an output of the amplifier; and
a switch circuit that is configured to control continuity of the bypass line in accordance with a first control signal and a second control signal, wherein the switch circuit is turned on when a power level of the input signal is higher than or equal to a reference level and the switch circuit is turned off when the power level of the input signal is lower than the reference level, the switch circuit including a first FET and a second FET connected in series in this order between the one end and the other end of the bypass line, a first resistance element connected in series to a gate of the first FET, and a second resistance element connected in series to a gate of the second FET,
wherein the first control signal is supplied to the gate of the first FET via the first resistance element,
wherein the second control signal is supplied to the gate of the second FET via the second resistance element, and
wherein a product of a numerical value of a gate length and a numerical value of a gate width of the first FET and a numerical resistance value of the first resistance element is smaller than a product of the numerical value of a gate length and the numerical value of a gate width of the second FET and the numerical resistance value of the second resistance element.

2. The amplification circuit according to claim 1, wherein the numerical values of the gate length and the gate width of the first FET and the second FET correspond to a same unit for length, and the numerical resistance values of the first resistance element and the second resistance element correspond to a same unit for electrical resistance.

3. The amplification circuit according to claim 1, further comprising:
a first switch element that is connected in series between a ground and a point between the first FET and the second FET, wherein the first switch element is turned on in accordance with a third control signal when the power level of the input signal is lower than the reference level; and
a control circuit configured to output the first control signal and the third control signal,
wherein the control circuit outputs the third control signal and the first control signal such that the first FET is turned off after the first switch element has been turned on.

4. The amplification circuit according to claim 3, further comprising a second switch element that is connected in series between the ground and a point between the filter circuit and the capacitor, wherein the second switch element is turned off in accordance with a fourth control signal when the power level of the input signal is lower than the reference level, and
wherein the control circuit outputs the fourth control signal such that the second switch element is turned off after the first FET has been turned off.

5. The amplification circuit according to claim 4, further comprising an inductor connected in series with the capacitor between the output of the filter circuit and the input of the amplifier.

6. The amplification circuit according to claim 5, wherein the second switch element is connected between the inductor and the capacitor.

7. The amplification circuit according to claim 1, further comprising a second capacitor connected between the output of the amplifier and the other end of the bypass line.

8. An amplification circuit comprising:
a filter circuit to which an input signal is supplied;
an amplifier provided at a stage subsequent to the filter circuit;
a capacitor connected in series between an output of the filter circuit and an input of the amplifier;
a bypass line one end of which is connected between the output of the filter circuit and the capacitor and the other end of which is connected to an output of the amplifier;
a switch circuit that is configured to control continuity of the bypass line in accordance with a first control signal and a second control signal, wherein the switch circuit includes a first FET and a second FET connected in series in this order between the one end and the other end of the bypass line, and a first switch element that is connected in series between a ground and a point between the first FET and the second FET; and
a control circuit configured to output the first control signal and the second control signal such that the switch circuit is turned on when a power level of the input signal is higher than or equal to a reference level and the switch circuit is turned off when the power level of the input signal is lower than the reference level,
wherein the control circuit supplies the first control signal and the second control signal to a gate of the first FET and a gate of the second FET, respectively, such that the second FET is turned off after the first FET has been turned off.

9. The amplification circuit according to claim 8, wherein the first switch element is turned on in accordance with a third control signal when the power level of the input signal is lower than the reference level, and
wherein the control circuit outputs the third control signal and the first control signal such that the first FET is turned off after the first switch element has been turned on.

10. The amplification circuit according to claim 9, further comprising a second switch element that is connected in series between the ground and a point between the filter circuit and the capacitor, wherein the second switch element is turned off in accordance with a fourth control signal when the power level of the input signal is lower than the reference level,
wherein the control circuit outputs the first control signal and the fourth control such that the second switch element is turned off after the first FET has been turned off.

11. The amplification circuit according to claim 10, further comprising an inductor connected in series with the capacitor between the output of the filter circuit and the input of the amplifier.

12. The amplification circuit according to claim 11, wherein the second switch element is connected between the inductor and the capacitor.

13. The amplification circuit according to claim 8, further comprising a second capacitor connected between the output of the amplifier and the other end of the bypass line.

14. The amplification circuit according to claim 8, wherein the switch circuit further includes a first resistance element connected in series to a gate of the first FET, and a second resistance element connected in series to a gate of the second FET.

15. The amplification circuit according to claim 14, wherein the first control signal is supplied to the gate of the first FET via the first resistance element,
wherein the second control signal is supplied to the gate of the second FET via the second resistance element.

16. The amplification circuit according to claim 15, wherein a product of a numerical value of a gate length and a numerical value of a gate width of the first FET and a numerical resistance value of the first resistance element is smaller than a product of the numerical value of a gate length and the numerical value of a gate width of the second FET and the numerical resistance value of the second resistance element.

17. The amplification circuit according to claim 16, wherein the numerical values of the gate length and the gate width of the first FET and the second FET correspond to a same unit for length, and the numerical resistance values of the first resistance element and the second resistance element correspond to a same unit for electrical resistance.

18. The amplification circuit according to claim 1, wherein the first FET and the second FET switch on and off at different times.

19. The amplification circuit according to claim 1, wherein a time at which the first FET switches from an on state to an off state is smaller than a time at which the second FET switches from an on state to an off state.

* * * * *

UNITED STATES PATENT AND TRADEMARK OFFICE
CERTIFICATE OF CORRECTION

PATENT NO. : 11,283,413 B2
APPLICATION NO. : 16/554887
DATED : March 22, 2022
INVENTOR(S) : Daisuke Watanabe et al.

It is certified that error appears in the above-identified patent and that said Letters Patent is hereby corrected as shown below:

In the Specification

Column 5, Line 61, "Q" should be -- $\Omega$ --.

Column 5, Line 64, "p" should be -- $\mu$ --.

Signed and Sealed this
Thirty-first Day of January, 2023

Katherine Kelly Vidal
*Director of the United States Patent and Trademark Office*